TUNNEL DIODE LOGIC CIRCUIT

Filed Jan. 4, 1961 2 Sheets-Sheet 1

INVENTOR:
WILLIAM PEIL,

BY Dudley T. Ready
HIS AGENT

Dec. 29, 1964 W. PEIL 3,163,775

TUNNEL DIODE LOGIC CIRCUIT

Filed Jan. 4, 1961 2 Sheets-Sheet 2

INVENTOR.
WILLIAM PEIL,

BY Dudley T. Ready
HIS AGENT

United States Patent Office 3,163,775

Patented Dec. 29, 1964

3,163,775
TUNNEL DIODE LOGIC CIRCUIT

William Peil, North Syracuse, N.Y., assignor to General Electric Company, a corporation of New York Filed Jan. 4, 1961, Ser. No. 80,621
9 Claims. (Cl. 307—88.5)

This invention relates to solid state digital computer circuits suitable for ultra high bit rates. In particular, a novel logic circuit is disclosed which utilizes as the primary gain element a two terminal semiconductor device that exhibits a region of negative resistance in the forward direction of bias, this device being commonly referred to as a "tunnel diode."

Digital data processing at ultra high rates, on the order of $10^8$ bits per second or higher, places severe requirements on the components incorporated in the processing equipment. The basic requirement is the capability of a correspondingly high frequency response. One of the few components which has this capability is the tunnel diode.

The tunnel diode digital circuits generally utilize the analog summation of input signals to selectively control "firing" of the tunnel diode. That is, the circuits utilize the tunnel diode property of producing a large change in voltage across the diode terminals in response to a small change in current by combining the input signals to either provide or not provide a current of a "firing" value to cause the large change in voltage in accordance with the desired logic.

Since the output signal is dependent upon whether or not the analog summation of the input signals provides the required threshold current for firing the tunnel diode, the reliability of the logic circuits is dependent upon the proper amplitude and timing (phase) of the input signals. In practice, it has proved difficult to construct circuits providing input signals within the tolerances involved insuring the presence or absence of a "firing" current applied to the tunnel diode.

In designing digital circuits there are of course many interrelated problems involved in addition to maintaining the digital signals in synchronism and maintaining a standard signal amplitude. These problems usually must be solved by special techniques applicable to specific components. One particular problem with circuits employing a tunnel diode, which is a one port device having common input and output terminals, is the isolation between the input and output.

Another problem in high speed digital circuits employing tunnel diodes arises in interconnecting the logic circuits. At the high frequencies considered here, the lead inductance becomes a large factor which dictates stringent limitations on lead lengths. For example, for a hundred megacycle bit rate, leads are typically limited to less than two inches. In a complex logic system, including feedback across several stages for example, the inductance of signal conductors can become prohibitive. One approach to a solution of this problem is the use of various kinds of distributed impedance transmission lines to provide interconnection of information signals. However, the tunnel diode to which the signals are applied is a nonlinear device. This nonlinearity is necessary for the kind of gain operation desired and has made impedance matching with input transmission lines impractical.

Accordingly, it is an object of the invention to reduce the tolerance requirement in tunnel diode logic circuits.

It is a further object of the invention to improve signal synchronization in a tunnel diode logic circuit.

It is a still further object of the invention to provide a tunnel diode logic circuit in which the output circuitry permits improved unilateral signal propagation.

Another object of the invention is to provide a tunnel diode logic circuit with a constant input impedance.

Briefly stated, in accordance with one aspect of the invention, a logic circuit is provided which utilizes a tunnel diode as the primary gain element. The tunnel diode is forwardly biased to a low voltage, low current condition and a sinusoidal clock source is connected to the diode to tend to periodically fire the diode. Input logic circuitry is connected to the tunnel diode to apply input signals timed to coincide and combine with the clock signal to selectively inhibit firing the diode in accordance with the input signals and the desired logic. Circuitry including a transistor is provided between the input logic circuitry and the tunnel diode which permits only unilateral signal transmission to subsequent circuits and provide a constant impedance match to input signals.

The features of the invention which are believed to be novel are set forth with particularity in the appended claims. The invention itself, however, both as to its organization and method of operation, together with further objects and advantages thereof, may best be understood by reference to the following description when taken in connection with the drawings wherein:

Figure 1:
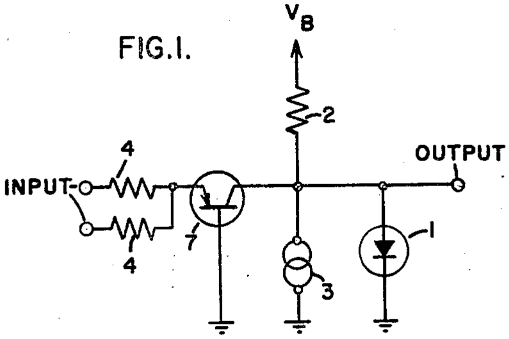
FIGURE 1 is a schematic diagram of a tunnel diode logic circuit incorporating the invention.

A simple logic circuit incorporating the invention is illustrated in FIGURE 1 in schematic form. The active device providing the essential gain of the circuit is a diode 1, one terminal of which is connected to a source of common potential, represented as ground in FIGURE 1. The diode 1 is a two terminal semiconductor device having a voltage-current characteristic with a region of negative resistance in the forward direction of bias commonly called a "tunnel diode." A D.C. voltage source $V_B$ is connected through a high valued resistor to the second terminal of the diode. The voltage source and resistor are selected to provide a low voltage, low constant current bias conveniently one-half of the voltage and current of the diode peak. A clock source 3 is also connected to the second terminal of the diode to provide a current which when added to the D.C. bias current exceeds the peak current of the diode. The clock current is preferably sinusoidal and is synchronized with the computer bit cycle. Input signals are applied to the circuit through resistors 4 and intermediate transistor 7 to the second terminal of diode 1. The transistor 7 provides isolation of the input circuitry from the tunnel diode output and a constant impedance match for input signals. The resistors are selected to apply the input signals in such a manner that the diode either exceeds or does not exceed its peak current in accordance with the desired logic.

Figure 2:
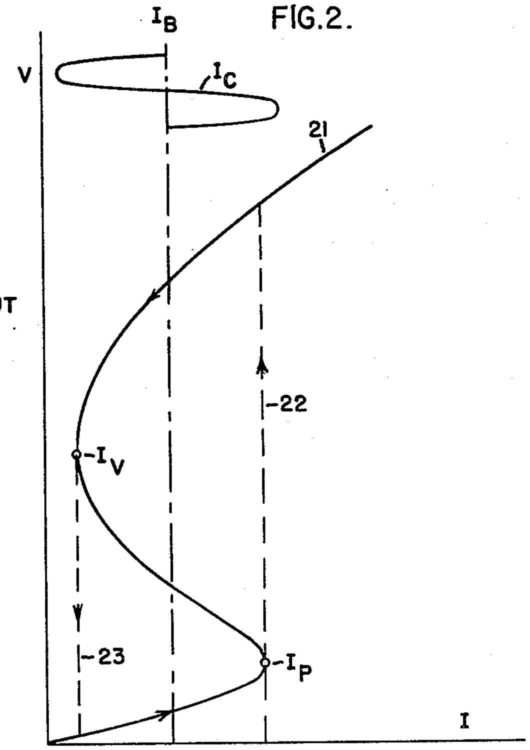
FIGURE 2 is a graph of the voltage-current characteristic of the tunnel diode in FIGURE 1.

A voltage-current characteristic of the tunnel diode 1 is plotted in FIGURE 2. The current is plotted as the abscissa and the voltage is plotted as the ordinate. The characteristic of the diode itself for either small currents or large currents in the forward direction is a positive resistance function very similar to that of a conventional semiconductor rectifier. However, the tunnel diode has an intermediate range of negative resistance. For this range of currents, with a voltage source applied across the diode, there are two bistable values of voltage, one higher and one lower than the voltage value for a given negative resistance current, which appear in the diode characteristic. When the tunnel diode is connected to a current source, the characteristic follows the dashed line 22 for increasing current and the dashed line 23 for decreasing current. For the purpose of the present description, line 22 can be considered the diode "peak current," $I_p$, and line 23 the diode "valley current," $I_V$. The feature particularly useful for logic operations is the large voltage change for a small increase in current as the current exceeds the peak current of the tunnel diode. This rise in voltage is referred to as "firing" the tunnel diode.

A tunnel diode voltage-current characteristic is frequency dependent. The portion of the characteristic for voltages exceeding that at the valley current, $I_V$, deteriorates at high frequencies. At a hundred megacycles, the voltage and current condition assumed by the diode after firing is actually close to the valley current condition. However, the first portion of the characteristic, for voltages less than the valley current is determined principally by "quantum tunnelling." This effect is very fast and the essential portion of the characteristic is substantially constant up to many kilomegacycles.

In a circuit designed in accordance with the disclosed invention, the principal noise is contributed by the clock as it traverses the portion of the characteristic below peak current, $I_p$. It can be seen from FIGURE 2 that this factor is inherently a small fraction of the output voltage obtained upon firing the diode. In practice, a reduction of tolerances on the circuit permits a larger noise factor and it has been found that it is substantially simpler to obtain and produce tunnel diodes which do not require an initial low resistance characteristic.

Also illustrated in FIGURE 2, is the clock current waveform $I_C$ superimposed on the constant bias current $I_B$. The amplitude of the clock current when added to the bias current is sufficient to drive the tunnel diode above its peak current, and thereby fire the diode.

The circuit operation is dependent upon the gain element exhibiting the FIGURE 2 voltage-current characteristic. It is to be understood that a gain element, other than a tunnel diode, which exhibits the same type of current-voltage characteristic may be utilized in practicing the disclosed invention.

Figure 3:
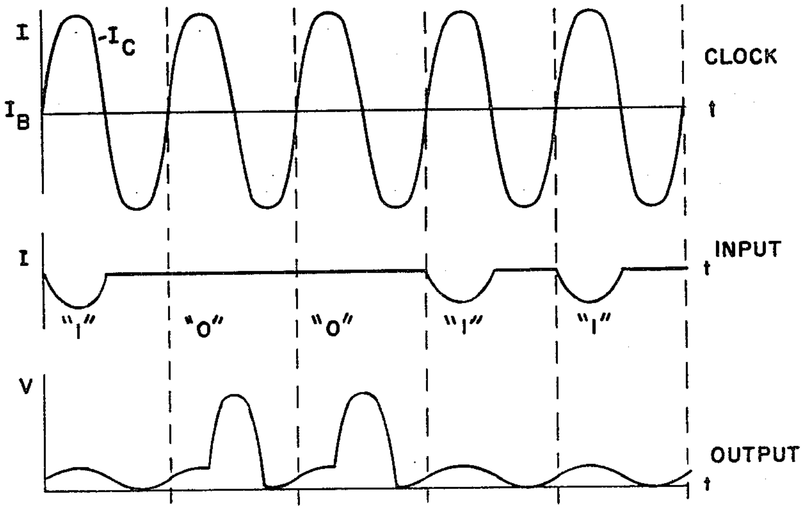
FIGURE 3 is a graphical representation in time of the clock, input and output waveforms in the FIGURE 1 circuit.

FIGURE 3 is a graph of three quantities, the clock, input and output waveforms, for a typical series of operations of the FIGURE 1 logic circuit. Each positive half cycle of the clock current, when added to the bias current, is sufficient to "fire" the tunnel diode. However, when a negative input pulse coincides with the positive clock signal, the tunnel diode is inhibited from firing and only a small sinusoidal voltage appears at the output as illustrated at the pulse period where "1's" appear in the input. When the input pulse is a "0," firing of the tunnel diode by the clock current is not inhibited and a high voltage pulse appears at the output. In practice, the output will be connected through a suitable resistor and a current proportional to the output voltage results. It can therefore be seen that the output of the FIGURE 1 logic circuit will be the inversion of the input information with a reversal of polarity. This circuit may then be used in further logic operation. An advantageous feature of the circuit operation is that the clock, and the noise it produces, is in quadrature with the output signal which substantially removes any effective interference therebetween.

The sinusoidal clock signal specified for the FIGURE 1 circuit, in conjunction with the bias current, is sufficient to fire the tunnel diode, if not inhibited by the input signal currents. There are numerous variations from this mode of operation within the scope of the invention. For example, instead of the inhibit mode, the clock current can be made less than that sufficient to fire the tunnel diode and the input logic signals adapted to selectively supply the current differential to enable firing. The provision of a D.C. bias current is primarily for convenience. The clock current can be made sufficient in itself to provide the firing current. However, the tunnel diode requires a finite recovery time after reverse current so that high frequency operation requires the avoidance of reverse currents. Also, the waveform of the clock current need not be sinusoidal, but this form is advantageous for enabling two logic operations per clock cycle, as will be more fully explained hereinafter in connection with FIGURE 4 and for simplified clock signal waveform propagation. The essential feature in each of these arrangements remains that a clock source is employed in providing the firing current for the tunnel diode. Accordingly, the clock directly determines the firing time. Generally, the clock current is the primary contributor to the firing current and the input signal currents are a fraction thereof. Accordingly, variations in the input signals have only a fractional effect on the selection of output signals which correspondingly reduces the tolerance requirements on the input signals and the circuits producing them.

For logic circuit operation at bit rates on the order of a few hundred megacycles, carbon resistors are satisfactory. A conventional D.C. voltage supply and a conventional oscillator are suitable for the bias and clock source. Suitable tunnel diodes are those having a ten milliampere peak current germanium diode using a high current density material and suitable transistors are diffused base type 2N–769 conventionally biased. The transistors are selected for their isolation properties. No gain is required of them and accordingly their gain-bandwidth product limitations do not directly limit the frequency of operation of the logic circuit.

Figure 4:
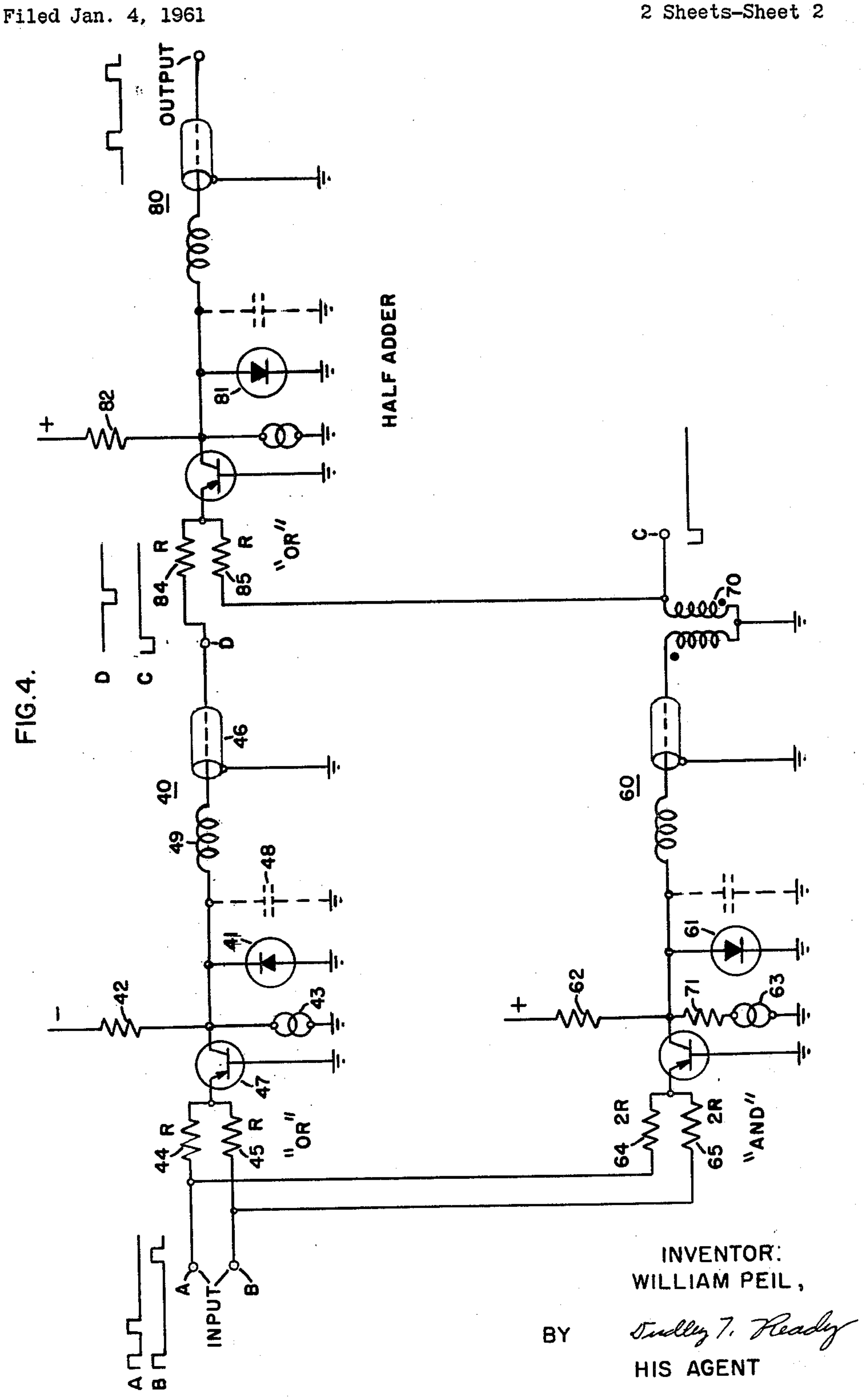
FIGURE 4 is a schematic diagram of a half adder utilizing logic circuits incorporating the invention.

A typical half adder, utilizing three logic circuits incorporating the disclosed invention, is illustrated in schematic form in FIGURE 4. The three circuits 40, 60 and 80 are practical forms of the FIGURE 1 circuit and are adapted to perform the desired inverted "or," "and" and inverted "or" operations, respectively. That is, the circuits are adapted and arranged to produce the desired logic outputs. As explained above, inverted outputs are inherent operations of the circuits.

The inverted "or" circuit 40 is essentially the same as the FIGURE 1 circuit. The tunnel diode 41 is connected to a sinusoidal clock source 43 and is poled for firing by the negative half cycle of the clock. A bias resistor 42 is connected to a negative D.C. voltage source to provide a low negative current and voltage condition for the diode 41, absent an uninhibited firing current from the clock source. Each of a pair of resistors 44 and 45 connects one of the input terminals A and B through a transistor 47 to the tunnel diode 41. The resistors are selected to have a resistance value of R such that an input voltage corresponding to a one on either terminal A or B (or both) produces a current sufficient to inhibit firing of the diode. The output of the tunnel diode is connected through a coaxial delay line 46 producing a half clock cycle delay. A plurality of outputs are normally available from the circuits. However, those not used are terminated in dummy loads. A p-n-p transistor is illustrated in FIGURE 4. Actually, for negative bias and positive input signals, n-p-n transistors simplify the circuitry in a manner well known to one skilled in the art. An inductor 49 is connected in series between the diode and the transmission line which together with the stray capacitance 48 provides an impedance match to the transmission line.

The "and" gate circuit 60 is similar to the circuit 40. The input resistors 64 and 65 are selected to have resistances of 2R such that a "1" input voltage at both the A and B terminals is necessary to control firing of the tunnel diode. In this logic circuit, the clock current is attenuated by resistor 71 to below firing amplitude and the logic signal currents are required to additively combine with the clock current to produce firing of the diode. The tunnel diode 61 is poled oppositely from the tunnel diode 41 and the bias resistor is accordingly connected to a positive potential source. The clock source 63 is $\pi$ radians out of phase with clock source 43 or is connected through a $\pi$ radians delay line to the diode 61 to produce synchronous firing of diodes 41 and 61. An inverter element 70 is inserted in series with the output to reverse the polarity of the output signals.

The inverted "or" gate circuit 80 is substantially the same as circuit 40. Here, the only variation is the reversal of the poling of the tunnel diode 81 and connection of the bias resistor 82 to a source of positive potential. These changes are made because of the polarity reversal of the signals in the outputs of circuit 40 and 60.

The operation of the half adder of FIGURE 4 is straightforward. The intermediate outputs in boolean notation are as follows:

$$\text{Circuit } \underline{40} \text{ output} = \overline{A+B}$$
$$\text{Circuit } \underline{60} \text{ output} = A \cdot B$$

The logic circuit 80 performs the same operation on its inputs as circuit 40 does on A and B. Accordingly:

$$\begin{aligned}\text{Circuit } \underline{80} \text{ output} &= \overline{\overline{A+B}+A\cdot B}\\ &= (\overline{\overline{A+B}})\cdot(\overline{A\cdot B})\\ &= (A+B)\cdot\overline{A\cdot B}\\ &= (A+B)\cdot(\overline{A}+\overline{B})\\ &= A\cdot\overline{A}+A\cdot\overline{B}+\overline{A}\cdot B+B\cdot\overline{B}\end{aligned}$$
$$\text{Circuit } \underline{80} \text{ output} = A\cdot\overline{B}+\overline{A}\cdot B$$

From the above it can be seen that the logic circuits incorporating the disclosed invention can be employed for general purposes in logic systems. As so employed, the systems can rely on the inherent clocking feature and the signal standardization of amplitude and phase of the individual circuits. Furthermore, the system performs two logic operations within each clock cycle. With an isolator such as a transistor, a constant impedance match is provided for input signals and in providing unilateral flow of information the circuit efficiency is increased. Since the impedance of the transistor seen by the clock signals is high relative to the output impedance, substantially all of the clock signal, as determined by the switching operation of the tunnel diode, appears as the output signal.

While the fundamental novel features of the invention have been shown and described as applied to illustrative embodiments, it is to be understood that the invention is not be limited thereto. For example, the dual of the FIGURE 1 circuit employing a gain element having a voltage-current characteristic similar to the tunnel diode current-voltage characteristic may be designed by employing a clock voltage source to tend to fire the gain element to a high current condition and selectively inhibiting firing by appropriate logic input voltages. The true scope of the invention, including those variations apparent to one skilled in the art is defined in the following claims.

What is claimed is:

1. A logic circuit comprising: a bistable two terminal regenerative gain element exhibiting a negative resistance to applied signals; clock means for supplying a periodic signal of a first amplitude to said gain element; a source of information signals digitally coded in discrete amplitudes and having a repetition rate compatible with the periodicity of said clock; input logic means for applying said information signals to said gain element timed to coincide with said periodic clock signals in amplitudes selected in accordance with a desired logic operation, the combined amplitudes of the signals at said gain element being adjusted to effect a firing of said gain element dependent on the digital coding of said information signal and said desired logic; and isolating means comprising a transistor, connected in common base configuration for linear, non-gainful operation connected between said input means and said gain element to provide unilateral propagation of signals from said gain element to subsequent circuits.

2. The logic circuit of claim 1, wherein said clock signal amplitude is greater than that required to fire said gain element, and the signals supplied from said input logic means are of a polarity opposed to that of said clock or zero, whereby the presence of a non-zero signal inhibits the firing of said diode.

3. The logic circuit of claim 1, wherein said clock signal amplitude is less than that required to fire said gain element, and the signals derived from said input logic means are of the same polarity as that of said clock or zero, whereby the presence of a non-zero signal effects a firing of said diode.

4. The logic circuit of claim 1 wherein said gain element is a tunnel diode.

5. The logic circuit of claim 1 wherein said isolating means is a junction transistor.

6. A logic circuit comprising: a bistable two terminal regenerative gain element having negative resistance; bias means connected to said gain element to forwardly bias said gain element at a low voltage, low current condition; clock means connected to said gain element to apply a sinusoidal current which tends to periodically fire said gain element; logic input means connected to said gain element in such a manner that applied digital input signals selectively control firing of said gain element in conjunction with said clock means; and output isolating means comprising a transistor, connected in the common base configuration for linear, non-gainful operation connected between said logic input means and said gain element to provide unilateral propagation of signals from said gain element to subsequent circuits.

7. The logic circuit of claim 6 wherein said gain element is a tunnel diode.

8. A logic circuit comprising: a tunnel diode; means connecting a first terminal of said diode to a source of common potential; bias means connected to the second terminal of said tunnel diode for forwardly biasing said diode at a low voltage, low current condition; clock means connected to said terminal to provide a current to fire said diode; logic input means connected to said second terminal arranged to receive at least one digital input information signal, said logic means and clock means producing a combined current into said second terminal such as to selectively fire said diode in accordance with the desired logic; and a transistor connected in the common base configuration for linear, non-gainful operation connected between said logic means and said diode to provide an isolated logic output signal.

9. A logic circuit comprisnig: a tunnel diode; means connecting a first terminal of said diode to a source of common potential; bias means connected to the second terminal of said tunnel diode for forward biasing said diode at a low voltage, low current condition; clock means connected to said second terminal to provide a sinusoidal current to fire said diode; logic input means connected to said second terminal and arranged to receive at least one digital input information signal which selectively inhibits firing of said diode by said clock means in accordance with the desired logic; and a transistor connected between said logic input means and said diode in a common base configuration for linear non-gainful operation to provide an isolated logic output signal.

References Cited by the Examiner

Article, "Electronics," January 29, 1960, pages 55–59.

Article, "I.B.M. Technical Disclosure Bulletin," vol. 3, No. 5, October 1960, page 42.

Lewin et al.: "The Tunnel Diode as a Logic Element," 1960, International Solids State Circuits Conference, February 1960, pages 10 and 11 (page 11 relied on).

Ryder: Electronic Fundamentals and Applications, Prentice-Hall, Eighth Printing, 1957 (pages 43, 776, 777 relied on).

International Dictionary of Physics and Electronics, Van Nostrand, 1956 Edition (page 28 relied on).

ARTHUR GAUSS, *Primary Examiner*.

GEORGE N. WESTBY, *Examiner*.